Sept. 5, 1967 J. ZIMMERMAN ETAL 3,340,161
PRINTED CIRCUITS AND METHOD OF MANUFACTURE THEREOF
Filed Feb. 19, 1964
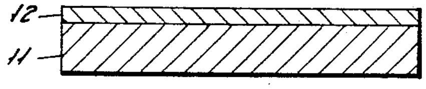
STAGE 1
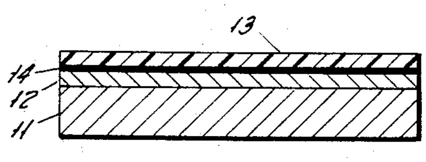
STAGE 2
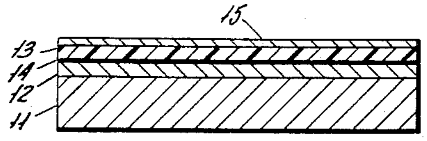
STAGE 3
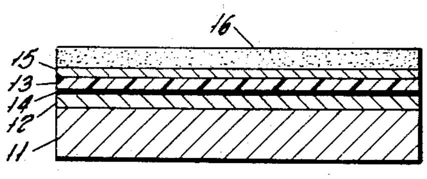
STAGE 4
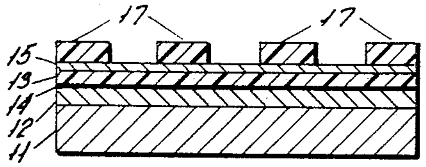
STAGE 5
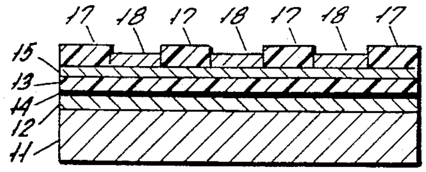
STAGE 6
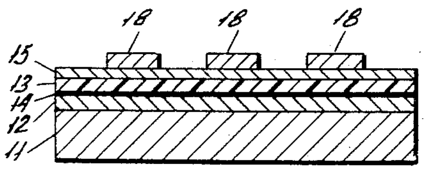
STAGE 7
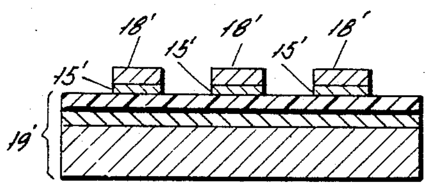
STAGE 8
INVENTORS
JULIUS ZIMMERMAN
VICTOR TROVATO
BY
Raymond R. Skolnick

United States Patent Office 3,340,161
Patented Sept. 5, 1967

3,340,161

PRINTED CIRCUITS AND METHOD OF MANUFACTURE THEREOF

Julius Zimmerman, Brooklyn, N.Y., and Victor Trovato, Red Bank, N.J., assignors to Sperry Rand Corporation, Long Island City, N.Y., a corporation of Delaware Filed Feb. 19, 1964, Ser. No. 346,038
2 Claims. (Cl. 204—15)

ABSTRACT OF THE DISCLOSURE

The method for the manufacture of printed circuits on anodized aluminum substrates, involving the initial formation on the anodized layer of a thin silica film followed by the application of a silicone coating thereon, the latter being baked to cure the coating and simultaneously seal the pores of the anodized layer. The thus coated and sealed layer is thereafter sensitized with stannous and palladium salts and immersed in an electroless copper plating bath to deposit a relatively thin copper layer atop the silicone coating. A photosensitive resist is then formed atop such copper layer and a relatively thick copper layer in the desired printed circuit pattern is electrolytically plated thereon, the resist and underlying thin copper layer subsequently being removed to provide the desired printed circuit board.

The present invention relates to a method for the manufacture of printed circuits and to the resulting printed circuit boards, and more particularly to such a method for producing a printed circuit pattern on an anodized aluminum substrate.

Electrical printed circuit boards frequently develop localized "hot spots" which may lead to failure of certain circuit components or, at least, to change of the desired circuit parameters. In order to overcome the problems resulting from such hot spots it is known to design printed circuits with so-called heat sinks therein.

It is among the objects of the present invention to provide a high temperature-resistant printed circuit board which minimizes the production of localized hot spots and thereby obviates the necessity for the incorporation of heat sinks in the design of the printed circuit pattern thereon.

A further object of the invention is to provide a relatively simple and economical method for the preparation of such a printed circuit board.

The nature and objects of the invention will be more fully apparent from a consideration of the following detailed description thereof, taken in connection with the accompanying drawing illustrating successive stages in the manufacture of a high temperature-resistant printed circuit board in accordance with a preferred embodiment of the invention.

In accordance with this invention a high temperature-resistant printed circuit board is provided comprising an aluminum substrate upon which the desired electrically conductive circuit pattern is superposed and, between which substrate and circuit pattern is interposed a non-conductive anodized layer formed on the aluminum substrate. The aluminum substrate acts as an electrical ground and thermally conductive medium, preventing the build-up of localized hot spots, and thereby eliminating the necessity for heat sinks in the printed circuit configuration, and the non-conductive anodized layer acts as a dielectric, insulating the circuit pattern from ground.

It has been found that the use of anodized aluminum substrates for printed circuit boards is particularly desirable because of the relatively high operating temperatures possible with aluminum base circuit boards, and the dimensional tolerances which may be met employing such substrates as compared with various resinous materials and high temperature ceramics employed for this purpose. Since aluminum substrates may serve as electrical ground connections themselves, their use further simplifies the production of printed circuits. Moreover, printed circuit boards incorporating aluminum substrates are unbreakable whereas resinous or ceramic boards are subject to breakage and fracture.

According to a further feature of the invention, a method is provided for producing such a high temperature resistant printed circuit board by initially forming and sealing an anodized film on the aluminum substrate, depositing a first relatively thin copper layer upon the thus treated substrate by chemical reduction, and thereafter electrolytically depositing a second relatively thick copper layer upon selected portions of the treated aluminum substrate to provide the desired circuit board.

The invention will be most clearly understood in connection with the preferred embodiment illustrated in the accompanying drawing. As shown in Stage 1 thereof, an aluminum base or substrate 11, which has been anodized in the conventional manner to produce a thin oxide film or layer 12 thereon, is initially sealed. Sealing of the anodized layer minimizes subsequent attack by acid or alkaline treatment solutions employed during formation of the printed circuit pattern thereon and thereby prevents the formation of electrical leakage paths through the di-electric layer 12.

Preferably, the anodized layer is sealed by the method described in copending application Ser. No. 333,654, filed Dec. 26, 1963 entitled, "Sealant for Anodized Aluminum Films." Such method involves initially forming a thin silica film atop the anodized layer, for example, by immersing the anodized aluminum substrate 11 in a heated aqueous solution of colloidal silica for an extended period. Preferably, the anodized substrate is immersed within a solution containing from 0.5 to 5.0 weight percent colloidal silica (e.g., "Ludox HS") maintained at a temperature of from about 100° F. to the boiling point of the solution for a period of from about 5 to 60 minutes. Best results have been achieved when a solution containing 1.0 weight percent colloidal silica is heated at its boiling point and the anodized aluminum substrate immersed therein for a period of from 15–20 minutes.

Alternatively, the silica film may be formed by immersing the aluminum substrate in an aqueous solution of ethyl silicate, which hydrolyzes to form the desired thin silica film.

The silica coated substrate is thereafter rinsed and, desirably, washed in a non-aqueous, water-miscible solvent such as methanol to extract water and thereby dry the silica film previously formed.

The dried layer is then treated with a solution of an organopolysiloxane to form a silicone coating 13 (Stage 2 of the drawing) thereon. The siloxane material is believed to interact with the silica film and seal the pores of the anodized layer 12 as indicated schematically at 14 in the drawing.

The organopolysiloxane utilized to form such silicone coating is a polysiloxane wherein a carbon atom of the organo group is directly bonded to silicon and the organo to silicon ratio is not greater than 2.01 and, preferably, is from about 0.5 to 2. As a general rule, the siloxanes utilized are those which, in the fully cured state, are solids and which comprise organo groups containing at least 40% monovalent hydrocarbyl radicals (monvalent groups composed of carbon and hydrogen). Any of the organo polysiloxanes disclosed in the aforesaid copending application Ser. No. 333,654, including the various monovalent hydrocarbyl, aminoalkyl, carboxyalkyl, hydroxyalkyl, cyanoalkyl, and vicinal epoxyalkyl substituted siloxanes may be utilized herein, employing the compositions and application techniques described more fully in the aforesaid application.

After curing the silicone coating 13 atop the sealed anodized layer 12, a relatively thin copper layer 15 (Stage 3 of the drawing) is formed thereon. Such layer is preferably plated by chemical reduction in accordance with the procedure described more fully in copending application Ser. No. 333,739, filed on Dec. 26, 1963 entitled, "Method of Copper Plating by Chemical Reduction." Such procedure involves initial sensitization of the substrate by treatment with a stannous salt, e.g., a solution of from 1.0 to 10.0 weight percent stannous chloride, and subsequent treatment with a salt of silver, gold, palladium or platinum, e.g., a solution of from 0.01 to 0.1 weight percent of palladium chloride.

Thereafter, the sensitized substrate is immersed in an aqueous plating bath constituted of from 0.003 to 0.02 mole per liter dissolved copper ions, from 0.02 to 0.08 mole per liter potassium hydroxide and from 0.11 to 1.1 moles per liter of an aldehyde polymer reducing agent, e.g. paraformaldehyde, trioxane or paracetaldehyde. A first, relatively thin copper layer having a thickness of from about .0003 to .0004 inch, and which is not subject to peeling, blistering or like defects upon subsequent electrodeposition of a second, thicker copper layer thereon as described below, is thereby produced.

It will be understood that the description of copending application Ser. No. 333,739, relating to such procedures and compositions for copper plating is incorporated herein by reference.

The thus sealed and plated anodized aluminum substrate is thereafter coated with a photosensitive resist 16, as illustrated in Stage 4 of the drawing. Any of the known resists which are commercially available for this purpose, e.g., diazo resins, bichromate resists or polyvinyl cinnamate resinous resists may be so employed.

After exposure of such a resist through a suitable transparent image, selected portions thereof may be developed and removed, leaving the complementary portions 17 (Stage 5) of the developed image as shown in the drawing. It will be understood that for this purpose, either positive or negative-acting photo-resists may be employed and either positive or negative transparencies utilized, thereby facilitating the removal of either the portions of the resist exposed to light or those portions corresponding to the complementary non-exposed areas.

As illustrated in Stage 6, the aluminum substrate 11 is thereafter immersed in an electrolytic bath in which a copper layer 18 is deposited through the developed portions 17 of the photosensitive resist, in the configuration of the desired circuit pattern. The copper layer 18 may be made of any desirable thickness, depending on the circuit requirement. Generally, layer thicknesses varying from about 0.001 to 0.003 inch provide optimum circuit configurations. The portions of layer 18 deposit directly atop the first, relatively thin plating 15 to define the desired conductive circuit pattern.

The residual portions 17 of the photosensitive resist are thereafter removed in conventional manner (Stage 7) and the remaining portions of the relatively thin copper layer 15 removed in the areas defined between the circuit portions 18.

In this manner, a final temperature-resistant printed circuit board 19 (Stage 8) is produced having a conductive pattern defined by a first, relatively thin layer of copper plating 15' remaining from the electroless deposition of Stage 3 and a second, relatively thick copper layer 18 resulting from the electrolytic deposition in Stage 6, the conductive circuit configuration being supported by a sealed anodized film 12 upon the aluminum substrate 11.

The following example is given for illustrative purposes; it will be appreciated that the invention is not limited to the preferred technique described in such example.

An aluminum part was degreased in a vapor phase degreasor, thereafter sprayed, under a pressure of 10 p.s.i.g., with a water stream containing alumina, and rinsed in water to insure thorough cleaning of the part. The substrate was then immersed in a 15% sulfuric acid anodizing bath, maintained in such bath at a temperature of 85° F. for a period of 45 minutes, and thereafter rinsed with water.

The anodized part was immersed in a boiling aqueous solution containing 1.0 weight percent of colloidal silica ("Ludox HS") for a period of 30 minutes. The coated substrate was then removed from the boiling colloidal silica solution, rinsed in water at room temperature, and thereafter washed in methanol to remove the residual water from the coating.

The coated part was then dipped in a bath containing 2 parts by weight of a gamma-aminopropylpolysiloxane containing silicon-bonded ethoxy groups (obtained by hydrolyzing gamma-aminopropyltriethoxysilane with an amount of water insufficient to react with all of the silicon-bonded ethoxy groups present on the starting saline, and subsequently condensing the hydrolyzate so formed to produce the desired polymer in the manner described in U.S. Patent No. 3,085,908), and one part methanol.

The part was retained in the siloxane-containing dipping bath for 5–10 minutes and then removed, air dried for 5–10 minutes and thereafter backed at a temperature between 250° and 300° F. for ½ hour to cure the silicone coating and simultaneously seal the pores of the anodized film.

The sealed anodized aluminum substrate was abraded with a fine abrasive paper (No. 400 "Wet Or Dry") and subjected to a water rinse.

The surface was then sensitized by immersion for between 1 and 2 minutes in a 2% aqueous solution of stannous chloride, acidified with hydrochloric acid. After again rinsing, the sensitization was completed by immersion of the treated part for 0.5 minute in an aqueous acidified solution of palladium chloride containing ½ gram palladium chloride per liter of solution.

After immersion in a further aqueous rinse bath the part was dipped, at room temperature, in a copper plating bath having the following composition:

| Ingredient: | Amount (per liter of solution), gm. |
|---|---|
| Copper sulfate (anhydrous) | 3 |
| Rochelle salt | 8 |
| Potassium hydroxide | 3 |
| Sym. trioxane | 15 |
| Water to make 1 liter. | |

Thereafter, a photosensitive resist (KPR Photo Resist) was coated atop the sealed aluminum substrate and the layer exposed through a transparency. The exposed resist was developed with a toluene base solvent to remove the portions of the resist which were not hardened by exposure.

The exposed and developed panel was immersed in an electrolytic copper plating bath and a patternwise copper layer 18 having a thickness of about 0.003 inch was produced between the residual portions of the developed resist.

If desired, the plated elements could, it will be noted, be solder-plated by subsequent electrodeposition of tin-lead alloy, or gold plating.

The residual portions of the resist were thereafter removed by rinsing the treated substrate in methylene chloride, and the non-image portions of the relatively thin copper layer dissolved by immersing the circuit board in a chromic acid bath.

There resulted a printed circuit board having a copper circuit pattern superposed on an aluminum substrate and including a sealed anodized dielectric layer therebetween.

Such board was found to provide rapid heat dissipation and permit operation at high temperatures without resulting in damage or failure of the printed circuit thereon.

Since certain changes may be made in carrying out the above method and in the resulting printed circuit board hereof without departing from the scope of this invention, it is intended that all matter contained in the above description or shown in the accompanying drawing shall be interpreted as illustrative and not in a limiting sense.

The embodiments of the invention in which an exclusive privilege or property is claimed are defined as follows:

1. A method for producing a high temperature-resistant printed circuit pattern on an anodized aluminum substrate, which comprises (a) treating the anodized layer for a period of from 5 to 60 minutes with an aqueous solution of colloidal silica containing from 0.5 to 5.0 weight percent silica at a temperature of between 100° F. and the boiling point of the solution to form a thin silica film atop the anodized layer;

(b) treating the substrate with a solution of an organopolysiloxane comprising an organo radical directly bonded to silicon and selected from the group consisting of monovalent hydrocarbyl, aminoalkyl, carboxyalkyl, hydroxyalkyl, cyanoalkyl, and vicinal epoxyalkyl radicals, said organo group comprising at least 40% monovalent hydrocarbyl radicals, to produce a silicone coating on said substrate;

(c) drying the coating and baking the substrate at a temperature of from 250° to 300° F. for a period of from 15 to 60 minutes to cure the silicone coating and simultaneously seal the pores of the anodized layer;

(d) sensitizing the substrate by treatment with a first solution containing from 1.0 to 10 weight percent stannous chloride and thereafter with a second solution comprising from 0.01 to 0.1 weight percent palladium chloride;

(e) immersing the thus treated substrate in an electroless copper plating bath containing from 0.003 to 00.2 mole per liter dissolved copper ions, from 0.02 to 0.08 mole per liter potassium hydroxide, and from 0.11 to 1.1 moles per liter of an aldehyde polymer reducing agent selected from the group consisting of trioxane, paraformaldehyde and paracetaldehyde, to deposit a first, relatively thin copper layer atop said silicone coating;

(f) applying a photosensitive resist material atop said relatively thin copper layer;

(g) exposing predetermined areas of said photosensitive resist;

(h) developing the exposed resist to remove selected portions thereof having the configuration of the desired printed circuit pattern;

(i) electrolytically plating a second, relatively thick copper layer on the said selected portions to produce the desired printed circuit pattern thereon; and (j) removing the residual portions of said resist and the underlying areas of said first copper layer to thereby provide the desired high temperature-resistant printed circuit board.

2. A method for producing a high temperature-resistant printed circuit pattern on an anodized aluminum substrate, which comprises:

(a) sealing an anodized layer on an aluminum substrate by immersing the anodized layer in an aqueous solution containing a material selected from the group consisting of colloidal silica and ethyl silicate;

(b) applying a coating of an organopolysiloxane thereto and baking the substrate to seal the pores of the anodized layer thereon;

(c) sensitizing the anodized surface with a stannous salt and a second material selected from the group consisting of silver, gold, palladium and platinum;

(d) immersing the thus treated substrate in an electroless copper plating bath containing from 0.003 to 0.02 mole per liter dissolved copper ions, from 0.02 to 0.08 mole per liter potassium hydroxide, and from 0.11 to 1.1 moles per liter of an aldehyde polymer reducing agent selected from the group consisting of trioxane, paraformaldehyde and para-acetaldehyde, to deposit a first, relatively thin copper layer atop said organopolysiloxane coating;

(e) applying a photosensitive resist material atop said relatively thin copper layer;

(f) exposing predetermined areas of said photosensitive resist;

(g) developing the exposed resist to remove selected portions thereof having the configuration of the desired printed circuit pattern;

(h) electrolytically plating a second, relatively thick copper layer on the said selected portions to produce the desired printed circuit pattern thereon; and (i) removing the residual portions of said resist and the underlying areas of said first copper layer to thereby provide the desired high temperature-resistant printed circuit board.

References Cited

UNITED STATES PATENTS

| | | | |
|---|---|---|---|
| 3,033,703 | 5/1962 | Schneble, et al. | 117—47 |
| 3,202,591 | 8/1965 | Curran | 204—38 |

FOREIGN PATENTS

| | | |
|---|---|---|
| 679,559 | 9/1952 | Great Britain. |

JOHN H. MACK, *Primary Examiner.*

T. TUFARIELLO, *Assistant Examiner.*